United States Patent [19]

Smith et al.

[11] Patent Number: 5,006,912
[45] Date of Patent: Apr. 9, 1991

[54] HETEROJUNCTION BIPOLAR TRANSISTOR WITH SIGE

[75] Inventors: Colin Smith, Bawdsey; Anthony D. Welbourn, Ipswich, both of England

[73] Assignee: British Telecommunications public limited company, United Kingdom

[21] Appl. No.: 368,362

[22] PCT Filed: Apr. 14, 1988

[86] PCT No.: PCT/GB88/00289

§ 371 Date: Jun. 1, 1989

§ 102(e) Date: Jun. 1, 1989

[87] PCT Pub. No.: WO88/08206

PCT Pub. Date: Oct. 20, 1988

[30] Foreign Application Priority Data

Apr. 14, 1987 [GB] United Kingdom ............... 8708926

[51] Int. Cl.$^5$ ........................................... H01L 29/72
[52] U.S. Cl. .................................... 357/34; 357/16; 357/60; 357/90; 357/4; 357/61
[58] Field of Search ............... 357/34, 34 HB, 16, 60, 357/61, 90, 4

[56] References Cited

U.S. PATENT DOCUMENTS 3,275,906  9/1966  Matsukura et al. ............... 317/234
4,529,455  7/1985  Bean et al. ........................ 148/175

FOREIGN PATENT DOCUMENTS

2719464A1  12/1978  Fed. Rep. of Germany.
63-118485  5/1988  Japan ........................... 357/34 HB

OTHER PUBLICATIONS

"Heterojunction Bipolar Transistor Using Pseudomorphic GaInAs for the Base"—P. M. Enquist et al.—*Applied Physics Letters* 49 (3), 21 Jul. 1986—pp. 179–180.
"High–Mobility FET in Strained Silicon", by Robert W. Keys, *IEEE Transactions on Electron Devices*, ED-33, (1986), Jun., No. 6, New York, N.Y., U.S.A.—p. 863.
Kroemer–"Theory of a Wide–Gap Emitter for Transistors"–Proceedings of the IRE, Apr. 12, 1957, pp. 1535–2537.
Kroemer—"Heterostructure Bipolar Transistors and Integrated Circuits"—Proceedings of the IEEE, vol. 70, No. 1, Jan. 1982, pp. 13–25.
Bean et al.—"GexSi1-x/Si Strained–Layer Superlattice Grown by Molecular Beam Epitaxy"—J. Vac. Sci. Technol. A1(2) Apr.–Jun. 1984, pp. 436–439.
R. People—"Indirect Band Gap of Coherently Strained GexSi1-x Bulk Alloys on <001> Silicon Substrates"—Physical Review B, vol. 32, No. 2, 15 Jul. 1985, pp. 1405–1408.
Lang et al.,—"Measurement of the Band Gap of GexSi1-x/Si Strained–Layer Heterostructures"—Appl. Phys. Lett 47 (12), 15 Dec. 1985, pp. 1333–1335.
Tatsumi et al.—"Si/Ge0.3Si0.7/Si Heterojunction Bipolar Transistor made with Si Molecular Beam Epitaxy"—Appl. Phys. Lett 52(11), 14 Mar. 1988, pp. 895–897.
Patton et al.—"Silicon–Germanium–Base Heterojunction Bipolar Transistors by Molecular Beam Epitaxy"—IEEE Electron Device Letters, vol. 9, No. 4, Apr. 1988, pp. 165–167.
No Author, "Modulation—Doped Superlattice Base Heterojunction Bipolar Transistor (MODHBT)", *IBM*

(List continued on next page.)

*Primary Examiner*—William Mintel
*Attorney, Agent, or Firm*—Nixon & Vanderhye

[57] ABSTRACT

A heterojunction bipolar transistor has an emitter which comprises an expitaxial layer of silicon grown on a silicon and germanium base layer. The active region of the transistor comprises a semiconductor having a silicon/silicon and germanium strained lattice and the silicon and germanium base layer is grown on a silicon substrate while maintaining commensurate growth. The lattice strain is such as to produce a predetermined valence band offset at the emitter/base junction. The mobility in the base is also enhanced over that of an unstrained alloy of the same composition.

17 Claims, 3 Drawing Sheets

OTHER PUBLICATIONS

*Technical Disclosure Bulletin*, vol. 32, No. 3B, Aug. 1989, pp. 128–131.

Temkin et al., "$Ge_xSi_{1-x}$ Strained–Layer Heterostructure Bipolar Transistors", *Appl. Phys. Lett.*, 52(13), 28 Mar. 1988, pp. 1089–1091.

Shen et al., "Novel Transport Phenomena in $Si/Si_{1-x}Ge_x/Si$ Double–Heterojunction Bipolar Transistors", *Semicond. Sci. Technol.*, 4(1989), 370–375.

Manasevit et al., "The Properties of $Si/Si_{1-x}Ge_x$ Films Grown on Si Substrates by Chemical Vapor Deposition", *Journal of Electronic Materials*, vol. 12, No. 4, 1983, pp. 637–647 and 650–651.

Bean et al., "Pseudomorphic Growth of $Ge_xSi_{1-x}$ on Silicon by Molecular Beam Epitaxy", *Applied Physics Letters*, 44(1), 1 Jan. 1984, pp. 102–104.

Treitinger et al.—"Ultra–Fast Silicon Bipolar Technology", Published by Spriner–Verlap, 1988.

GROWN ON Si

GROWN ON SiGe

HETEROJUNCTION BIPOLAR TRANSISTOR WITH SIGE

BACKGROUND OF THE INVENTION

1. Field of the Invention

This invention relates to a heterojunction bipolar transistor.

2. Related Art

There is continuing and increasing interest in improving the operating speed of bipolar transistors in microcircuits, particularly in the context of VLSI circuits for high-speed and ultra high-speed logic applications.

One route to such speed improvements, which has been relentlessly pursued to the practical limits of existing technology, is the reduction in feature size of the devices. In connection with this, new self-aligned processes, which remove the need to provide for alignment tolerances, continue to be developed.

An alternative route to achieving higher operating speeds is to use gallium arsenide (GaAs) or other related III-V compound semiconductors in place of silicon, since the electron mobility and saturation velocity are higher in GaAs and the other III-Vs than in silicon. Unfortunately, although at first sight it appears possible to achieve a respectable speed increase by producing GaAs versions of bipolar transistors which are conventionally made of silicon, such an approach does not in fact give rise to any significant improvement in performance. The problem is that, in such devices, it is necessary to keep the base width small, and use only low levels of base doping, with the result that the base resistance tends to be high. In order to keep the base resistance acceptably low, high hole mobility is needed. Unfortunately, although electron mobility in GaAs is high (which is useful for giving short emitter-collector transit times), hole mobility is less than half that of silicon, resulting in excessive base resistance.

An approach to making high speed bipolar devices in GaAs which gets round the limitation of poor hole mobility is to produce the device as a heterojunction bipolar transistor (HBT) using aluminium gallium arsenide (AlGaAs) and gallium arsenide (GaAs).

In an HBT, the emitter is formed of a material having a larger energy gap than the base, whereby injection of holes from the base into the emitter is prevented and it becomes possible to use heavy base doping, and hence very thin (1,000 Å) base widths, without excessive base resistance.

Unfortunately, although HBTs theoretically offer quite exceptional performance (for more details of which see the review paper by Herbert Kroemer in PROC.IEEE, Vol. 70, No. 1, Jan. 1982), they have proved exceedingly difficult to make.

The bulk of the work done on HBTs has involved the use of AlGaAs and GaAs, in part because of the superior electronic properties of GaAs, but also because it is possible to make very high quality AlGaAs-GaAs heterojunctions. Unfortunately, fabrication of GaAs HBTs is very complex because of the difficulties inherent in GaAs processing. In particular, the absence of a native oxide means that processing is limited to etching and non-selective deposition, which in turn means that GaAs devices are essentially non-planar. It can be seen, therefore, that there are appreciable costs associated with the speed advantages offered by GaAs. It is to the reduction of these costs, while realising the benefits of improved speed, that work on HBTs has been directed in recent years.

The comparative ease with which silicon can be processed and the ubiquitous nature of silicon processing together provide a strong incentive for the development of an HBT which is compatible with existing silicon technology. A few silicon based wide-gap emitter transistors have been reported. For example, gallium phosphide-silicon has been tried with disappointing results; and, with a heavily-doped "semi-insulating polycrystalline" silicon emitter on a silicon base (the polycrystalline/amorphous silicon having a wider band gap than that of the single crystal silicon of the base), the results achieved have been better, but are still a long way short of those obtained with AlGaAs/GaAs. Consequently, research on HBTs continues to be centered on the use of GaAs.

SUMMARY OF THE INVENTION

The aim of the invention is to provide a method of fabricating HBTs which is largely compatible with known silicon processing techniques.

The present invention provides a heterojunction bipolar transistor having an emitter which comprises an epitaxial layer of silicon grown on a silicon and germanium base layer, the active region of the transistor comprising a semiconductor having a silicon/silicon and germanium strained lattice, and the lattice strain being such as to produce a predetermined valence band offset at the emitter/base junction while maintaining commensurate growth, wherein the base comprises an alloy of silicon and germanium, the alloy being grown on a {100} plane of silicon.

Advantageously, the lattice strain is such as to enhance the effective mobility of electrons in the base. Preferably, the lattice strain is tailored throughout the base depth such that the energy separation between the low mobility and high mobility conduction bands is increased towards the collector.

In a preferred embodiment, the germanium content of the silicon and germanium base layer lies within the range of from 12% to 20%, and is preferably at least 15%.

Using a silicon germanium alloy base, it is possible to produce devices which, apart from the growth of the heterolayers, are made using conventional silicon processing steps. The heterolayers may be grown using molecular beam epitaxy (MBE).

BRIEF DESCRIPTION OF THE DRAWINGS

Embodiments of the invention will now be described with reference to the accompanying drawings in which.

DETAILED DESCRIPTION OF EXEMPLARY EMBODIMENTS

Since silicon and germanium have different lattice constants, it is possible to tailor lattice strains by adjusting the relative proportions of silicon and germanium in the alloy layers. In this way, it is possible to engineer band structures and band offsets, so that charge carrier transport can be modified. However, layer thickness is limited, since dislocations result from excessive thickness, the critical thickness being dependent upon the germanium content.

Figure 1:
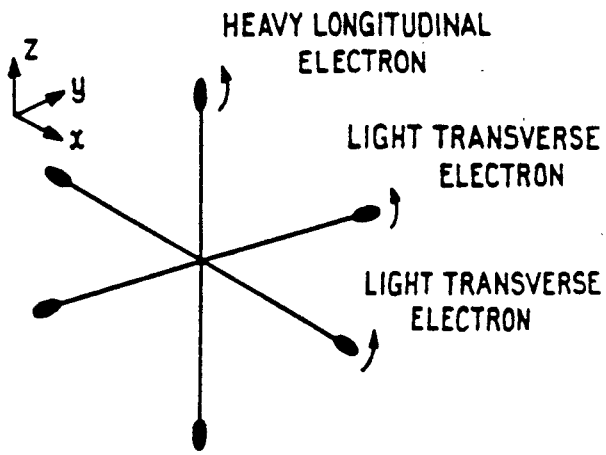
FIG. 1 shows six-fold degeneracy of the silicon conduction band.
Figure 2A:
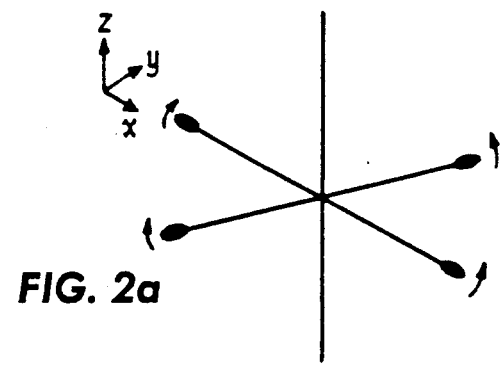
FIG. 2a shows the four-fold degeneracy of the conduction band of strained {100} Si-Ge layers.
Figure 2B:
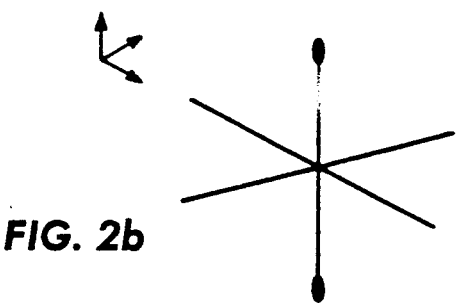
FIG. 2b shows the two-fold degeneracy of the conduction band of strained silicon.

In unstrained SiGe, the conduction band remains Si-like until the molar Ge content exceeds about 85%. It has a six-fold degeneracy with a conduction band minimum lying in each of the <100> directions (see FIG. 1). Thus, for an electron travelling in a given direction, the effective mass is averaged over all six minima since these are approximately equally occupied. In the <100> direction, this requires averaging over two heavy longitudinal masses (0.98 $m_o$) and four light transverse masses (0.19 $m_o$), and gives 0.45 $m_o$, where $m_o$ is the stationary electron mass. But, for SiGe grown on a {100} Si plane, the unit cell is distorted from the cubic system into the orthorhombic, by forcing the atoms closer together in the plane. This breaks the six-fold conduction band degeneracy, and forces two minima up in energy (by about 150-170 meV when the Ge content is 20%) and four down (see FIG. 2). Thus, the lowest conduction band consists only of the four lobes which lie in the plane, and an electron traversing this layer experiences mainly the light transverse electron mass. The effective mass is, therefore, lowered to that of the transverse mass which is similar to that of silicon. Thus, in the strained layer, the electron's effective mass is reduced, and its mobility increased over that of unstrained alloys of the same composition. However, the mobility will not scale directly with effective mass.

If the heterostructure were to be grown on a {111} plane, the distortion would be from the cubic into the hexagonal system. As the six-fold symmetry of the resulting crystal would remain, the degeneracy of the conduction band would not be split, and the effective mass of the electron would not be significantly altered.

Figure 3A:
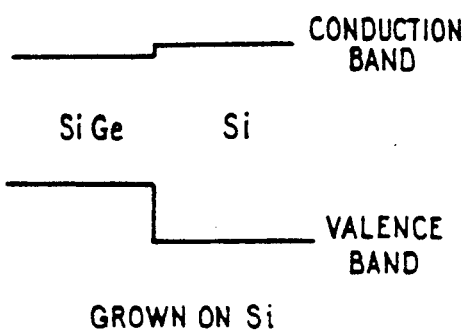
FIGS. 3a and 3b shows the band discontinuity in {100} Si:Si-Ge.
Figure 3B:
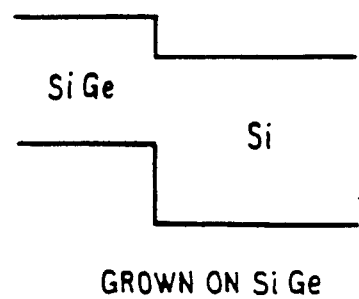

In addition to the mobility changes associated with the heterostructure, the layers of differing composition have different band-gaps and offsets. If a SiGe layer is grown on a {100} Si substrate, there is a small discontinuity in the conduction band, but a major discontinuity in the valence band. Following growth on a SiGe substrate (which may simply be a thick SiGe buffer layer grown on Si), there is a discontinuity in both bands, as shown in FIGS. 3a and 3b. This discontinuity varies with both strain and composition.

In the <111> direction, valence band offsets are similar to those in the <100> direction, but the conduction band in the Si is lower than in the SiGe for all substrates.

Figure 4:
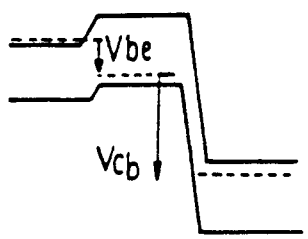
FIG. 4 shows the band structure of a conventional silicon bipolar transistor.

FIG. 4 shows a schematic band structure of a conventional npn silicon transistor under normal bias conditions. Because the emitter has to be very heavily doped, it suffers bandgap narrowing, and there is a smaller barrier to holes than to electrons at the base-emitter junction. As the current gain in a well-designed transistor is given largely by the ratio of electrons and holes crossing this junction, the base must have a much lower doping than the emitter. This also prevents breakdown.

Figure 5:
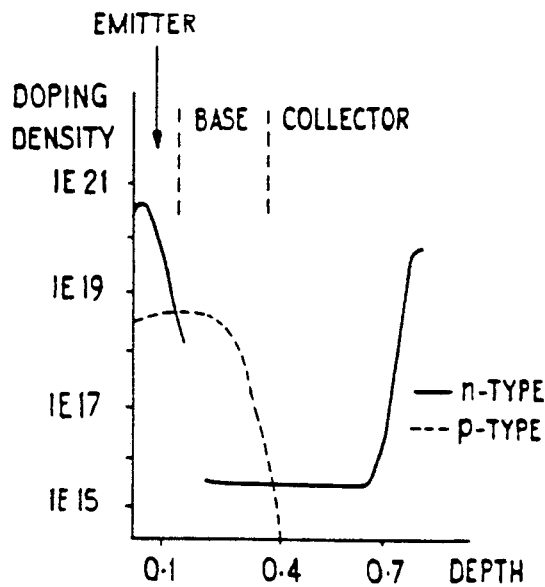
FIG. 5 shows the doping levels of the same conventional silicon transistor.

For high frequency operation, the base must be narrow, because the electrons drift across this (with a low effective acceleration voltage of kT/q, where k in Boltzmann's constant, T is the thermodynamic temperature, and q is the charge). Consequently, the collector must have a low doping, so that the depletion layer is in the collector rather than in the base. Otherwise the base would punch through at too low a collector voltage. This gives a large depletion region, and a large contribution to the transit time, even though the electrons traverse it at saturated drift velocity. A compromise is usually made between punch-through voltage, collector transit time and collector capacitance, whereby the collector doping is increased deeper into the transistor. A typical doping regime is shown in FIG. 5.

As well as the time taken for the electrons to traverse the base and the collector, there is a component of transit time given by the product of the emitter resistance and the sum of base-emitter and base-collector capacitance. As the emitter resistance is the slope resistance of the diode, its value falls as emitter current increases. The transistor must, therefore, be operated at the highest possible value of current density to get the best speed. However, when the density of electrons injected into the base from the emitter becomes too large, the base-collector junction is pushed into the collector (the Kirk effect), and the time taken for electrons to drift across the base increases sharply. Thus, there is a natural maximum operating current which is related to the base doping.

The effects of these individual time constants are summed into one figure of merit, the transit frequency $f_t$, which is inversely proportional to the sum of the transit times. Clearly, the larger this parameter is, the faster circuits can operate. However, when a real transistor is made, the circuit is also slowed down by the time constant of the base resistance and the collector-base capacitor. A second figure of merit $f_{max}$ is applied which takes account of this effect. As the base is low-doped, the base resistance is high, and only by using very fine dimensions (particular layer-layer tolerances) can $f_{max}$ be made reasonably large. Self-aligned bipolar transistors are under development, and these promise very large values of $f_{max}$, such that $f_t$ once again becomes the limiting factor. Values of $f_t$ in excess of 10-15 GHz are extremely difficult to achieve with a conventional device.

Because there is an energy barrier preventing hole injection into the emitter, the wide-gap emitter HBT allows gain to be high, even for a heavily-doped base. Thus base resistance can be very low. More importantly, the base does not widen (as a result of the Kirk effect) until a much higher injection level, and the transistor may be operated at a significantly higher current density, thus reducing the emitter charging time. Also, the collector doping can be increased, without pushing the depletion region into the base, and the collector transit time is also reduced. Since the base width is less sensitive to operating voltage, it can be made somewhat smaller, to reduce its transit time. Finally, if a strained SiGe {100} layer is used for the base, the predicted mobility will reduce the base transit time even further.

Thus the silicon-germanium HBT offers a way to increase $f_t$ substantially above the values available with silicon bipolar transistors. A value of 20 GHz should be feasible for a 0.15-0.2 $\mu$m base width, with further improvement possible at even narrower dimensions.

Figure 6:
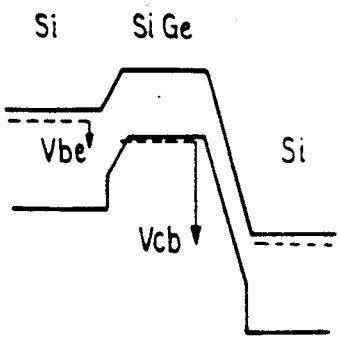
FIG. 6 shows the band structure of an HBT using Si:Si-Ge.

The foregoing theory suggests the use of a Si emitter with a SiGe base grown commensurately on {100} Si. FIG. 6 shows the band structure of a suitable layer arrangement.

Figure 7:
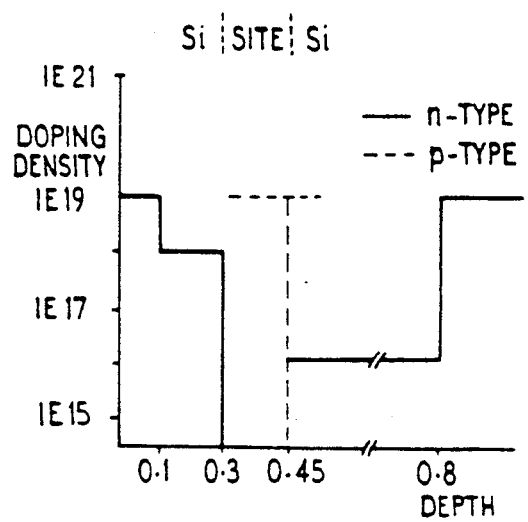
FIG. 7 shows the doping levels for a HBT with 15% germanium content in the base.
Figure 8:
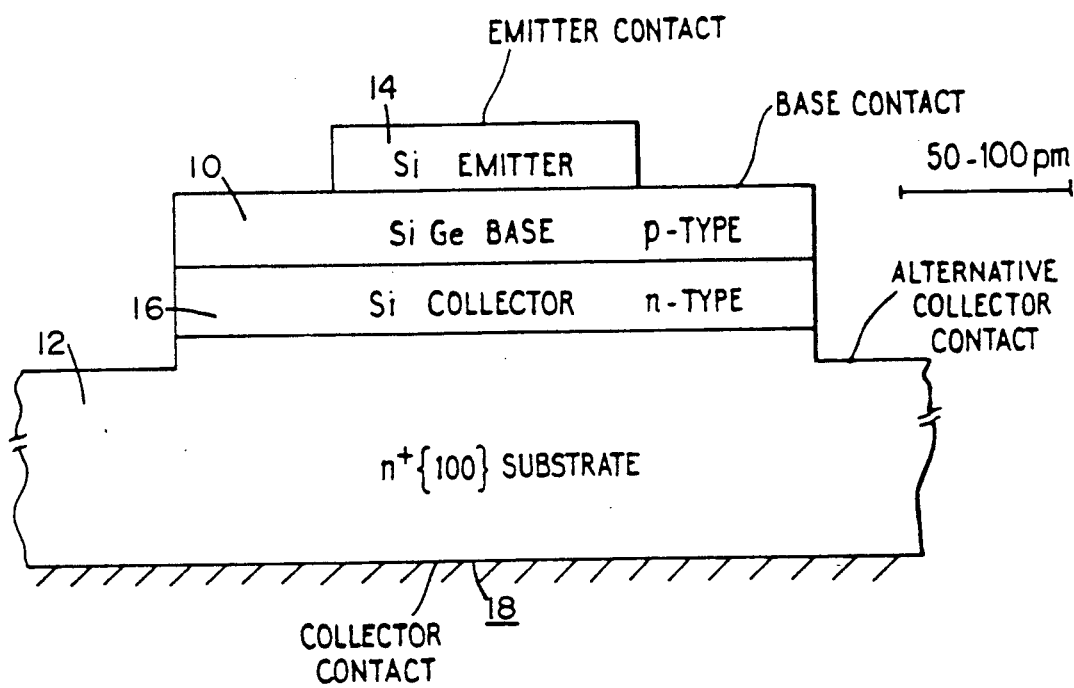
FIG. 8 shows a simple mesa etched HBT.

An example of a Si-Ge HBT of a very simple construction is shown in FIG. 8. The relevant doping profiles are shown in FIG. 7. This simple structure is readily formed using molecular beam epitaxy (MBE) and mesa etching.

At a base width of between 0.15 and 0.2 μm, the germanium content in the SiGe layer can be up to 20%, giving a bandgap discontinuity in the valence band of about 150 meV, whilst maintaining commensurate growth of the SiGe layer 10 on the Si substrate 12. Preferably, the germanium content of the SiGe layer 10 is at least 15%, though useful results are obtained with a lower germanium content. Assuming equal Gummel numbers in the base 10 and the emitter 14, a germanium content of 20% would give a gain of ~300, and this allows the base Gummel number to exceed that of the emitter 14. With a high base doping of 1E19, and an emitter doping of around 1E18, a gain of ~100 is obtained. This is an ideal value to give the required 3–5 V emitter-base breakdown voltage. To make contact to the emitter 14, this doping level is inadequate, but it can safely be increased at the surface, at a distance of at least 0.15–0.2 μm from the base 10. The collector can be doped at 1E16 to 2E16 to give a fairly short transmit time, and ample breakdown voltage, but should rise to a buried layer of 1E19 at a distance of about 0.2–0.5 μm. With this doping profile, the collector 16 must be silicon to ensure that the bandgap difference at the emitter junction appears in the valence band rather than the conduction band. The band discontinuity at the collector 16 junction has little effect, as it is swamped by the applied bias.

For a simple structure, such as that shown in FIG. 8, the collector 18 contact can be made to the back of the wafer 12, and the emitter area 14 can be defined by a mesa etching technique. Mesa etching right through the base layer 10, to reduce the base/collector contact area may be beneficial, but this etch need not be controlled accurately. FIG. 8 shows the structure formed in this manner, and FIG. 7 shows the required doping profiles.

For integrated devices, it is of course necessary to deposit dielectric and metal layers. This can be done using the techniques used in silicon processing. For high performance devices, selective epitaxy offers a method of reducing base area and also permits the introduction of heteroepitaxy after initial processing. This avoids problems with temperature cycling of strained materials.

We claim:

1. A heterojunction bipolar transistor having a doped silicon collector layer of a first conductivity type on a silicon substrate and an emitter of said first conductivity type which comprises an epitaxial layer of silicon grown on a silicon and germanium base layer of a second conductivity type which is grown on said silicon collector, wherein the active region of the transistor comprises a silicon/silicon and germanium strained lattice layer disposed between said emitter and collector layers, the lattice strain being such as to produce a predetermined valence band offset at the emitter/base junction.

2. A bipolar transistor as in claim 1, wherein the silicon and germanium base layer is grown epitaxially and commensurately on silicon.

3. A bipolar transistor as in claim 1 or 2, wherein the lattice strain enhances the effective mobility of electrons in the base above that of unstrained material of the same composition.

4. A bipolar transistor as in claim 1 or 2, wherein the base comprises an alloy of silicon and germanium, the alloy being grown on a {100} plane of silicon.

5. A bipolar transistor as in claim 4, wherein the lattice strain is tailored throughout the base depth such that the energy separation between two-fold and four-fold degenerate conduction bands is increased towards the collector.

6. A bipolar transistor as in claim 1 or 2, wherein the germanium content of the silicon and germanium base layer lies within the range of from 12% to 20%.

7. A bipolar transistor as in claim 6, wherein the germanium content of the base layer is at least 15%.

8. A bipolar transistor as in claim 1 or 2, wherein the transistor is fabricated by selective epitaxy.

9. A heterojunction bipolar transistor comprising:
a substrate having an emitter, base and collector formed on the substrate,
the emitter and collector being of a first conductivity type and the base being of a second, opposite conductivity type,
the base being formed on the collector and comprising a silicon and germanium layer,
the emitter comprising an epitaxial layer of silicon grown on the base,
the active region of the transistor comprising a silicon/silicon and germanium strained lattice, the lattice strain being such as to produce a predetermined valence band offset at the junction between the emitter and the base, and
wherein the base comprises an alloy of silicon and germanium, the alloy being grown on a {100} plane of silicon.

10. A heterojunction bipolar transistor comprising:
a silicon substrate;
a collector layer of silicon formed on said substrate;
a base layer grown on said collector over and commensurately with a {100} plane of silicon, the base layer comprising an alloy of silicon and germanium;
an emitter comprising an epitaxial layer of silicon grown on said base layer;
wherein the active region of the transistor comprises a semiconductor having a silicon/silicon and germanium strained lattice, the lattice strain being such as to produce a predetermined valence band offset at the junction between the emitter and the base.

11. A heterojunction bipolar transistor comprising:
a silicon substrate having a {100} plane as a growth surface,
an n-type silicon collector layer formed at the top of said substrate,
a p-type silicon-germanium base layer grown expitaxially on said collector and commensurately with said {100} plane,
an n-type emitter layer comprising an epitaxial layer of silicon grown on said base layer,
the silicon-germanium base layer being strained and providing a predetermined valence band offset at the junction between the emitter and the base.

12. A bipolar transistor as in claim 9, 10 or 11, wherein the silicon and germanium base layer is grown epitaxially and commensurately on silicon.

13. A bipolar transistor as in claim 9, 10 or 11, wherein the lattice strain is such as to enhance the effective mobility of electrons in the base, above that of unstrained material of the same composition.

14. A bipolar transistor as in claim 9, 10 or 11, wherein the lattice strain is tailored throughout the base depth such that the energy separation between two-fold and four-fold degenerate conduction bands is increased towards the collector.

15. A bipolar transistor as in claim 9, 10 or 11, wherein the germanium content of the silicon and germanium base layer lies within the range from 12% to 20%.

16. A bipolar transistor as in claim 15, wherein the germanium content of the base layer is at least 15%.

17. A bipolar transistor as in claim 9, 10 or 11, wherein the transisitor is fabricated by selective epitaxy.

* * * * *